US008416579B2

(12) United States Patent  
Biesheuvel et al.

(10) Patent No.: US 8,416,579 B2
(45) Date of Patent: Apr. 9, 2013

(54) ELECTRONIC ASSEMBLY FOR ATTACHMENT TO A FABRIC SUBSTRATE, ELECTRONIC TEXTILE, AND METHOD OF MANUFACTURING SUCH AN ELECTRONIC TEXTILE

(75) Inventors: Mark Biesheuvel, Dordrecht (NL); Martijn Krans, Eindhoven (NL); Rabin Bhattacharya, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 12/532,434

(22) PCT Filed: Mar. 26, 2008

(86) PCT No.: PCT/IB2008/051120
§ 371 (c)(1),
(2), (4) Date: Feb. 18, 2010

(87) PCT Pub. No.: WO2008/120138
PCT Pub. Date: Oct. 9, 2008

(65) Prior Publication Data
US 2010/0149767 A1    Jun. 17, 2010

(30) Foreign Application Priority Data

Mar. 29, 2007  (EP) .................................... 07105166

(51) Int. Cl.
*H05K 7/02*  (2006.01)
*H05K 7/04*  (2006.01)

(52) U.S. Cl. ........................................ 361/807; 361/777

(58) Field of Classification Search .................. 361/807, 361/809, 810, 772–774, 777; 174/254–255; 362/103
See application file for complete search history.

(56) References Cited

U.S. PATENT DOCUMENTS

| | | | | |
|---|---|---|---|---|
| 4,570,206 A * | 2/1986 | Deutsch | ........................ | 362/103 |
| 4,709,307 A * | 11/1987 | Branom | ........................ | 362/103 |
| 4,774,642 A * | 9/1988 | Janko et al. | ................... | 362/108 |
| 4,924,362 A * | 5/1990 | Janko et al. | ................... | 362/108 |
| 5,278,734 A * | 1/1994 | Ferber | ............................ | 362/103 |
| 5,440,461 A | 8/1995 | Nadel et al. | | |
| 5,758,947 A * | 6/1998 | Glatt | ............................. | 362/105 |
| 5,984,488 A * | 11/1999 | Tung | ............................. | 362/108 |
| 6,027,227 A * | 2/2000 | Tung | ............................. | 362/241 |
| 6,474,830 B1 | 11/2002 | Hansen | | |
| 6,511,198 B1 * | 1/2003 | Erickson | ........................ | 362/103 |
| 6,523,968 B1 * | 2/2003 | Walker | ........................... | 362/103 |
| 7,674,003 B2 * | 3/2010 | Sharrah et al. | ................ | 362/205 |
| 2006/0285327 A1 | 12/2006 | Abraham et al. | | |
| 2008/0297071 A1 * | 12/2008 | Ray et al. | ...................... | 315/312 |

FOREIGN PATENT DOCUMENTS

DE   202006007098 U1   8/2006
WO   2006129272 A2   12/2006

* cited by examiner

*Primary Examiner* — Hung S Bui
(74) *Attorney, Agent, or Firm* — Mark L. Beloborodov

(57) ABSTRACT

An electronic assembly (20; 30; 40; 50) for attachment to a fabric substrate (60; 82, 102) having a conductor pattern (62*a-b*; 85*a-b*; 107*a-c*) on a first side (63; 86; 108) thereof. The electronic assembly comprises an electronic device (23; 42; 64), and at least a first clamping member (21; 41; 65). The electronic assembly is, furthermore, adapted to clamp the electronic device (23; 42; 64) to the first side (63; 86; 108) of the fabric substrate (60; 82, 102) in such a way that the electronic device (23; 42; 64) is electrically connected to the conductor pattern (62*a-b*; 85*a-b*; 107*a-c*).

14 Claims, 5 Drawing Sheets

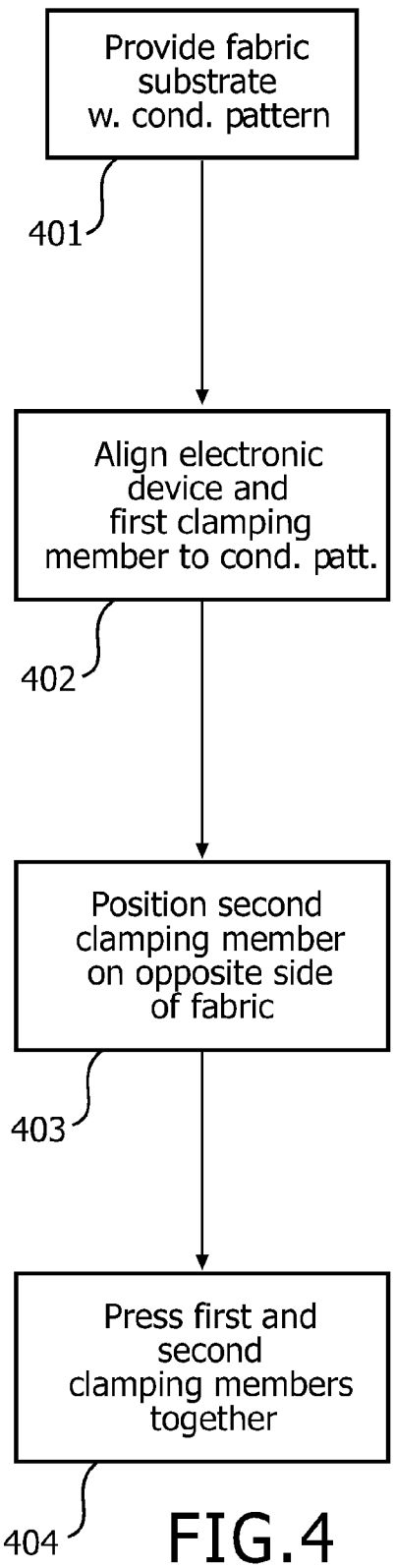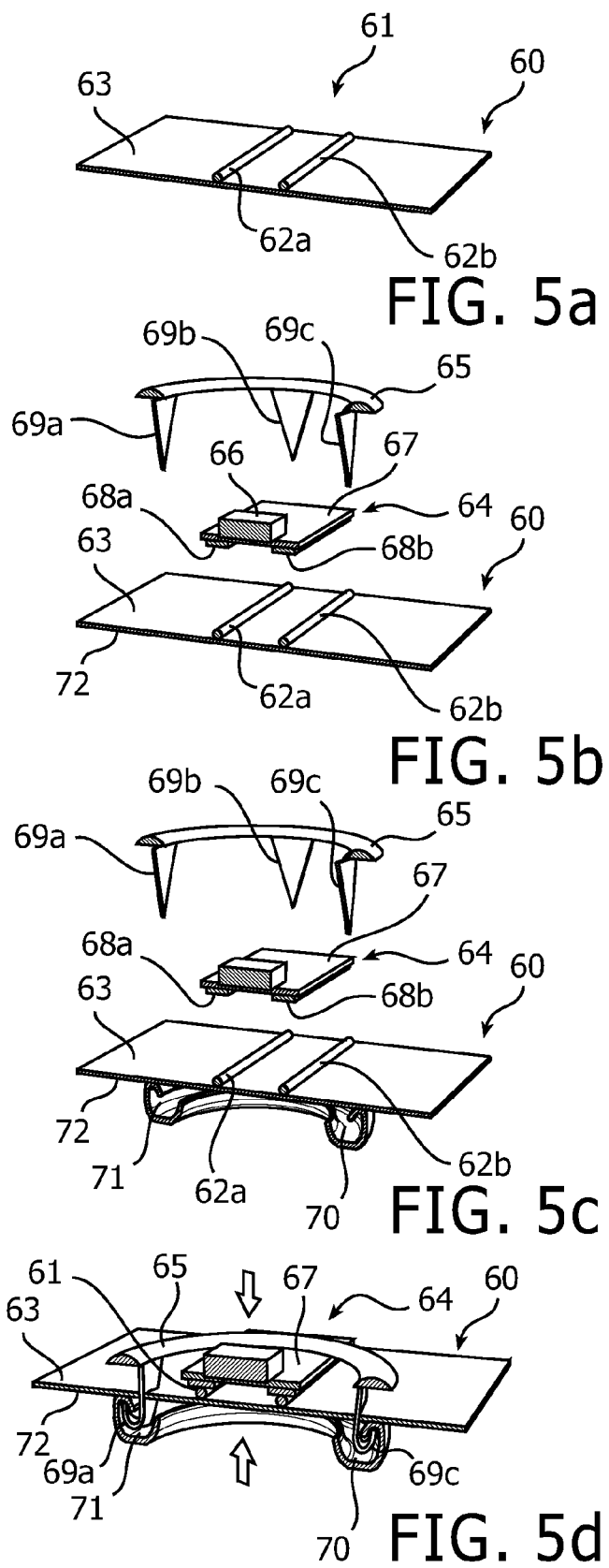

ELECTRONIC ASSEMBLY FOR ATTACHMENT TO A FABRIC SUBSTRATE, ELECTRONIC TEXTILE, AND METHOD OF MANUFACTURING SUCH AN ELECTRONIC TEXTILE

TECHNICAL FIELD OF THE INVENTION

The present invention relates to an electronic assembly for attachment to a fabric substrate having a conductor pattern on a first side thereof, comprising an electronic device, and at least a first clamping member, and an electronic textile comprising a fabric substrate and such an electronic assembly attached thereto.

The present invention further relates to a method for manufacturing such an electronic textile.

TECHNICAL BACKGROUND

Currently, research in the field of electronic textiles is very active, and although not a great deal of advanced electronic textile products can be found in the market-place today, it is expected that many new products will find their way to the consumers in the near future.

A problem facing the developers of advanced electronic textiles is how to interconnect electronic devices with each other and with a power source via conductors provided on the fabric substrate of the electronic textile. Furthermore, the electronic devices should be sufficiently firmly attached to the fabric substrate to enable normal handling and washing of the textile.

U.S. Pat. No. 5,440,461 discloses a securing assembly for attaching a light emitting element to fabric and electrically connecting the light emitting element to a conductor pattern provided on the fabric.

Referring to FIG. 1, this assembly 1 includes a two-piece enclosure having a first piece 2 with a base flange 3 and a central bore for receiving the light-emitting element 4, and a second piece 5 with a recess dimensioned to receive the base flange 3 through press-fit with a piece of the fabric 6 interposed there between.

To attach and connect the light-emitting element 4 to an exterior side 7 of the fabric 6, the light-emitting element 4 is first inserted in the first piece 2. The first piece 2 and light-emitting element 4 are then pressed against the fabric 6 such that electrodes 8a-b provided on the light-emitting element 4 penetrate the fabric 6. These electrodes 8a-b are pressed between the base flange 3 of the first piece 2 and the second piece 5 to be bent and retained against conductors 9a-b provided on an interior side 10 of the fabric 6 through the press-fit of the first 2 and second 5 pieces.

A drawback of this securing assembly is that individual control and addressing of each of a plurality of electronic devices appears very difficult to achieve, if at all possible. Furthermore, this securing assembly requires the light-emitting element to have electrodes in the form of "legs" which are suitable for penetration of a fabric, are bendable with relative ease without breaking, and are capable of making good electrical contact with the conductors 9a-b provided on the interior side 10 of the fabric 6.

SUMMARY OF THE INVENTION

In view of the above-mentioned and other drawbacks of the prior art, a general object of the present invention is to provide an improved electronics assembly for attachment to a fabric substrate, in particular facilitating individual control of each of a plurality of electronic devices attached to a fabric substrate.

It is, furthermore, desirable to enable attachment and connection of a wider variety of electronic devices.

According to a first aspect of the present invention, these and other objects are achieved through an electronic assembly for attachment to a fabric substrate having a conductor pattern on a first side thereof, comprising an electronic device, and at least a first clamping member, wherein the electronic assembly is adapted to clamp the electronic device to the first side of the fabric substrate in such a way that the electronic device is electrically connected to the conductor pattern on the first side.

By "fabric substrate" should, in the context of the present application, be understood a material or product manufactured by textile fibers. The fabric substrate may, for example, be manufactured by means of weaving, braiding, knitting, or felting. In particular, the fabric substrate may be woven or non-woven.

The conductor pattern may be provided to the fabric substrate in any manner known in the art. It may, for example, be provided in the form of monofilament or multifilament conductive wires which may be interwoven in the fabric substrate, or provided to the fabric substrate in any other way, such as by gluing. Alternatively, the conductor pattern may be formed by a conductive substance which may be applied to the surface of the fabric substrate through, for example, printing, electro-plating and patterning, or electro-forming.

The first clamping member may be made of any suitable material, conductive or non-conductive, and may be adapted to lockingly engage with the fabric substrate or with a second clamping member provided on the other side of the fabric substrate. In the latter case, a portion of at least one of these first and second clamping members may penetrate the fabric substrate to come into direct mechanical contact with the other, or neither of the first and second clamping members may penetrate the fabric substrate. In the latter case, the locking engagement through the fabric substrate takes place indirectly with the fabric substrate preventing direct contact between the first and second clamping members.

In the case of the clamping member being at least partly electrically conductive, unwanted short-circuiting of conductors on the fabric substrate and/or connectors provided on the electronic device may be avoided through proper positioning of the clamping member and/or the provision of insulating materials between relevant conductors and the clamping member.

Compared to the prior art which requires penetration of the fabric by electrodes in order to electrically connect an electronic device, the electronic assembly according to the present invention provides a greater degree of precision as to the points of electrical contact between the electronic device and the conductor pattern on the fabric. This greater precision enables a larger number of points of electrical contact between the electronic device and the conductor pattern, and facilitates individual addressing and control of each of a plurality of electronic devices attached to the fabric substrate.

Furthermore, the electronic assembly according to the present invention enables electrically connecting the electronic device to electrically separated conductor patterns provided on both sides of the fabric substrates. This further facilitates multi-point electrical contact and individual addressing and control of electronic devices attached to the fabric substrate.

Additionally, the electronic assembly according to the present invention may comprise practically any kind of electronic device, and is not restricted to electronic components having a particular shape, for example, cylindrical, or a particular electrode configuration, such as legs suitable for penetration of the fabric substrate.

In order to facilitate proper electrical connection between the electronic device and the conductor pattern on the fabric substrate, the electronic assembly according to the invention may further comprise an alignment marker. This alignment marker may be configured for direct alignment with the appropriate conductor pattern, or to a corresponding alignment marker provided on the fabric substrate.

The electronic assembly according to the present invention may advantageously further comprise a second clamping member adapted to lockingly engage with the first clamping member through the fabric substrate.

The clamping of the electronic device through the locking engagement of the first and second clamping members may be sufficiently strong to achieve electrical connection by means of so-called cold soldering, which entails a very good and durable electrical connection.

The electronic device comprised in the electronic assembly according to the invention may advantageously comprise a contact structure for pressing against the conductor pattern to thereby achieve an electrical connection there between.

The contact structure may be any kind of conductive member which is configured to achieve electrical contact with another conductor when pressed against that conductor. To this end, the contact structure may be provided in the form of a pad or a lead, which may, in order to decrease the contact resistance to the conductor against which it is pressed, have a sharp portion arranged to deform the surface of the conductor. In this manner, a possible insulating coating or oxidized layer on the conductor can be penetrated and the contact surface between the contact structure and the conductor be increased.

Furthermore, the electronic device may comprise an electronic component mounted on a component carrier having at least one contact structure arranged to face the first side of the fabric substrate.

The component carrier may be any kind of suitable electronics sub-mount, flexible or rigid, such as a conventional printed circuit board (PCB) or a flexible printed circuit (FPC).

By providing the electronic device as one or several electronic component(s) mounted on a component carrier, a large degree of freedom in choice of electronic component(s) is achieved. For example, a suitable component carrier can readily be designed to simultaneously accommodate a particular foot print and connector configuration of the electronic component and a particular given conductor pattern on the fabric substrate.

Obviously, electronic components may be mounted on either or both sides of the component carrier.

Furthermore, the substrate may be arranged to absorb the clamping forces exerted when clamping the first and second clamping members together, sandwiching the fabric substrate. The electronic component can thereby be electrically connected to the conductor pattern on the fabric substrate without being subjected to excessive mechanical stress in the process.

According to one embodiment, the component carrier may be provided as an intermediate member which is clamped against the fabric substrate, including the conductor pattern provided thereon, through the clamping action of the first and second clamping members. In order to facilitate proper positioning of the component carrier in relation to its associated clamping member, either or both of the component carrier and the clamping member may comprise an alignment marker.

In other words, the component carrier is, according to this embodiment, clamped between the first and second clamping member to be pressed against the fabric substrate at an appropriate location to achieve the desired electrical connection.

According to another embodiment, the electronic device may be integrated with any one of the first and second clamping members.

In this embodiment, a suitably shaped contact structure may be provided on the side of the first and/or second clamping member to make contact with the fabric substrate.

Moreover, the electronic assembly according to the present invention may further be adapted to provide an additional function related to the electronic device.

Such an additional function, in addition to attaching and electrically connecting the electronic device to the fabric substrate, may be any function related to the operation of the electronic device. Such additional functions may, for example, include physical protection of the electronic device, heat dissipation, electric decoupling, transmission and/or reception of electromagnetic signals, or any combination thereof. In the specific case of the electronic device being an optical device, such as a light emitting device or an optical sensor, the additional functions may, in particular, include altering any optical property of emitted and/or received light. Such optical properties, for example, include the spatial distribution, the angular distribution and/or the wavelength distribution of the emitted and/or received light.

This/these additional function(s) may be implemented by adding an additional functional member to the electronic assembly and/or adapting one or several of the first and second clamping members and the electronic device.

Additionally, the electronic assembly according to the present invention may advantageously be configured to electrically connect the electronic device to two or more electrically separated conductors in the conductor pattern on the first side of the fabric substrate.

Furthermore, the electronic assembly according to the present invention may be configured to connect the electronic device between a first conductor on the first side of the fabric substrate and a second conductor on an opposing second side of the fabric substrate.

For many kinds of fabric substrates, and in particular for a fabric substrate formed by interwoven electrically conductive and non-conductive yarns, this greatly facilitates individual addressing and control of electronic devices mounted on the fabric substrate.

Moreover, at least one of the first and second clamping members comprised in the electronic assembly according to the invention may comprise a structure for penetrating the fabric substrate and interlocking with the opposing clamping member.

Such a structure may, for example, be provided in the form of tooth-shaped prongs on one or both of the first and second clamping members.

Through such a penetrating structure, the electronic assembly can be attached in a very durable manner to the fabric substrate.

Furthermore, in the case of at least partly electrically conductive clamping members and penetrating structure, the penetrating structures can be used as one or several electric vias for electrically connecting the electronic device to one or several conductors provided on the opposite side of the fabric substrate.

According to yet another embodiment, the electronic assembly according to the present invention may further comprise an additional electronic device, wherein the electronic assembly is configured to clamp the additional electronic device to a second side conductor pattern provided on a second side of the fabric substrate in such a way that the additional electronic device is electrically connected to the second side conductor pattern. Hereby, an electronic textile which is, for example, capable of emitting light on both sides thereof may be realized.

Additionally, the electronic assembly according to the present invention may advantageously be included in an electronic textile, further comprising a fabric substrate.

Such an electronic textile, may, for example, include a power supply, control circuitry, and a plurality of individually controllable light-emitting diodes (LEDs), whereby a textile-based display device can be achieved.

According to a second aspect of the present invention, the above-mentioned and other objects are achieved through a method for manufacturing an electronic textile, comprising the steps of providing a fabric substrate having a conductor pattern on a first side thereof; providing an electronic assembly comprising an electronic device, and at least a first clamping member; positioning the first clamping member and the electronic device on the first side of the fabric substrate; aligning the electronic device to the conductor pattern; and locking the first clamping member in relation to the fabric substrate to clamp the electronic device to the first side thereof, thereby electrically connecting the electronic device to the conductor pattern.

The electronic assembly may further comprise a second clamping member adapted to lockingly engage with the first clamping member through the fabric substrate, and the method may further comprise the step of positioning the second clamping member on a second side of the fabric substrate opposite the first clamping member.

Additionally, the step of locking may comprise the step of moving the first and second clamping members towards each other until they lockingly engage through the fabric substrate, thereby electrically connecting the electronic device to the conductor pattern through clamping.

The first and second clamping members may be moved towards each other through gradually increasing pressure or through sudden impact, such as by means of a hammer tool.

Hereby, attachment and connection of an electronic device to a fabric substrate can be achieved in a single operation, without requiring special tooling or machinery.

As already discussed above, the electronic device may be provided separately from the first and second clamping members, or may be integrated with the one of the clamping members.

When provided separately, for example as an electronic component mounted on a carrier or substrate, the electronic device may be aligned to the conductor pattern on the fabric substrate prior to pressing the clamping members into engagement.

Alternatively, the clamping members may first be pressed together to commence engagement, leaving an open space/slit/slot between the first clamping member and the conductor pattern, where after the electronic device is aligned to the conductor pattern, and the clamping members pressed further towards each other to finalized the locking engagement there between and clamp the electronic device against the conductor pattern to thereby achieve electrical contact there between.

As discussed above in connection with the first aspect of the present invention, the electronic device may comprise a contact structure for pressing against the conductor pattern. In this case, the step of aligning the electronic device to the conductor pattern may include the step of aligning the contact structure to the conductor pattern.

This alignment may be facilitated by providing alignment markings on the electronic assembly and/or the fabric substrate.

Additionally, the method according to the present invention may further comprise the step of aligning the first clamping member to the contact structure.

Through this aligning it is ensured that the clamping forces act to press the contact structure against the conductor pattern in an efficient manner.

This alignment may advantageously be achieved by using a clamping tool being adapted to align the first clamping member and the electronic device to each other, when these are provided as separate parts.

Further features and advantages of this second aspect of the invention are analogous to those described above in connection with the first aspect.

BRIEF DESCRIPTION OF THE DRAWINGS

These and other aspects of the present invention will now be described in more detail, with reference to the appended drawings showing a currently preferred embodiment of the invention, wherein:

FIG. 4 is a flow chart schematically illustrating a method for manufacturing an electronic textile according to an embodiment of the present invention;

FIGS. 5a-d schematically illustrate the electronic textile manufactured according to the method of FIG. 3 in states following the corresponding method steps;

DETAILED DESCRIPTION OF A PREFERRED EMBODIMENT OF THE INVENTION

In the following description, the present invention is mainly described with reference to an electronic assembly for attachment to a fabric substrate including one or several light-emitting diodes (LEDs).

It should be noted that this by no means limits the scope of the invention, which is equally applicable to such electronic assemblies comprising any other suitable electronic device, such as a sensor, processing circuitry, a memory module, a radio transmitter/receiver etc.

Figure 1:
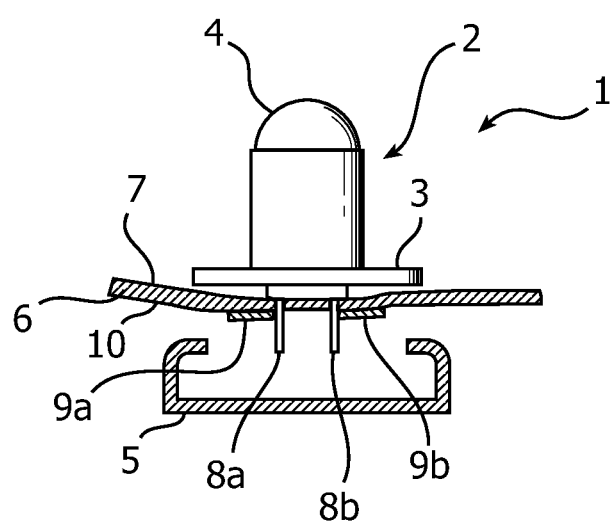
FIG. 1 illustrates a securing assembly according to prior art for attaching a light-emitting element to a fabric.
Figure 2A:
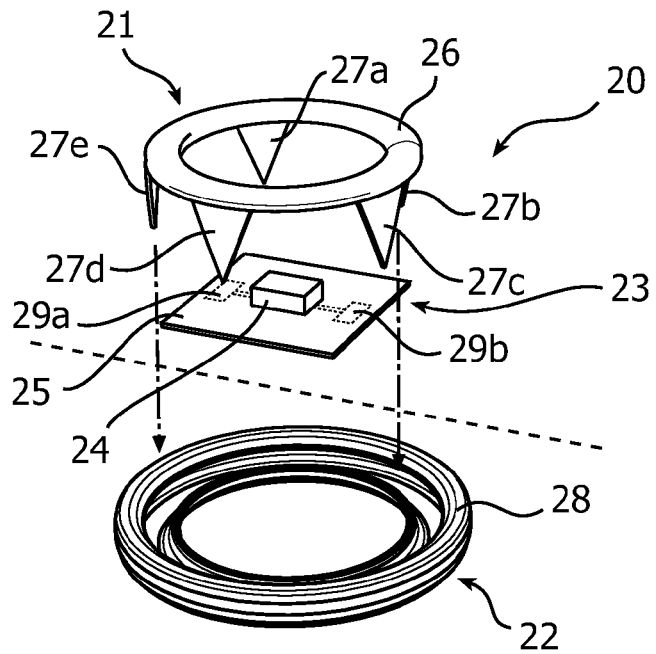
FIGS. 2a-b schematically illustrate two exemplary embodiments of the electronic assembly according to the invention, where the electronic device(s) is/are provided separately from the clamping members.
Figure 2B:
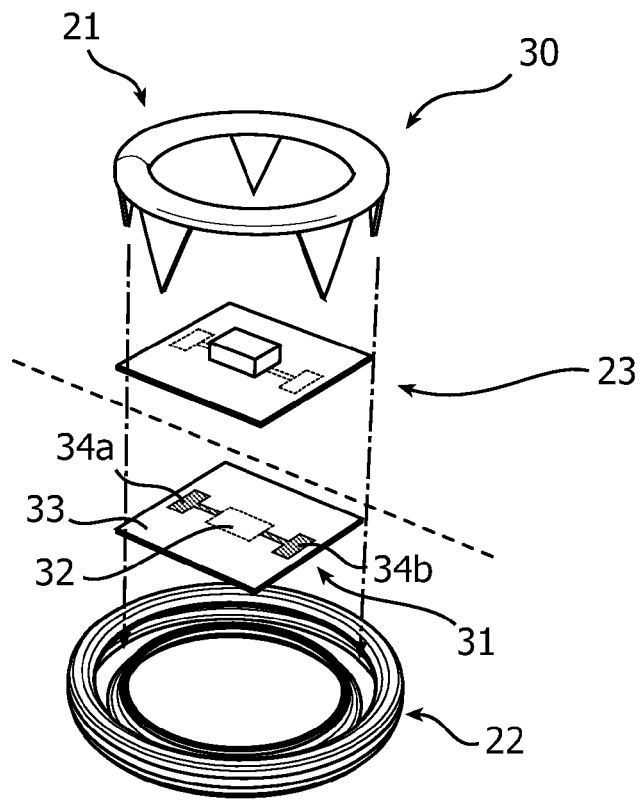

FIGS. 2a-b schematically illustrate two exemplary embodiments of the electronic assembly according to the invention, where the electronic device(s) is/are provided separately from the clamping members.

In FIG. 2a, an electronic assembly 20 is shown, having a first clamping member 21, a second clamping member 22, and an electronic device 23 in the form of an electronic component 24 mounted on a circuit board carrier 25. Terminals (not shown) of the electronic component are electrically connected to contact pads 29a-b provided on the side of the circuit board carrier 25 opposite the electronic component 24 (as indicated by dashed rectangles in FIG. 2a). The intended position of the fabric substrate relative to the first 21 and second 22 clamping members and the electronic device 23 is indicated by the dashed line between the electronic device 23 and the second clamping member 22.

In the presently illustrated example, the first clamping member consists of an annular body 26 having five tooth-like prongs 27a-e, and the second clamping member 22 has an annular recess 28 configured to receive and lock the prongs 27a-e of the first clamping member 21 when the first 21 and second 22 clamping members are pressed together as will be further discussed below in connection with FIG. 4.

The electronic assembly 20 illustrated in FIG. 2a is configured to attach and connect the electronic device 23 to one side of a fabric substrate (the same side as the first clamping member 21).

In FIG. 2b, another example of an electronic assembly 30 is schematically shown. This electronic assembly 30 differs from the electronic assembly 20 described above in connection with FIG. 2a, in that it includes an additional electronic device 31 to be attached to the opposite side of the fabric substrate. The intended position of the fabric substrate is again indicated by the dashed line in FIG. 2b. The additional electronic device 31 includes an electronic component 32 mounted on a circuit board carrier 33, and terminals (not shown) of the electronic component 32 are electrically connected to contact pads 34a-b.

The additional electronic device 31 may be different from, or of the same type as the previously described, oppositely located device 23. For example, the exemplary embodiment illustrated in FIG. 2b could be used for achieving an electronic textile emitting light on both sides thereof.

Figure 3A:
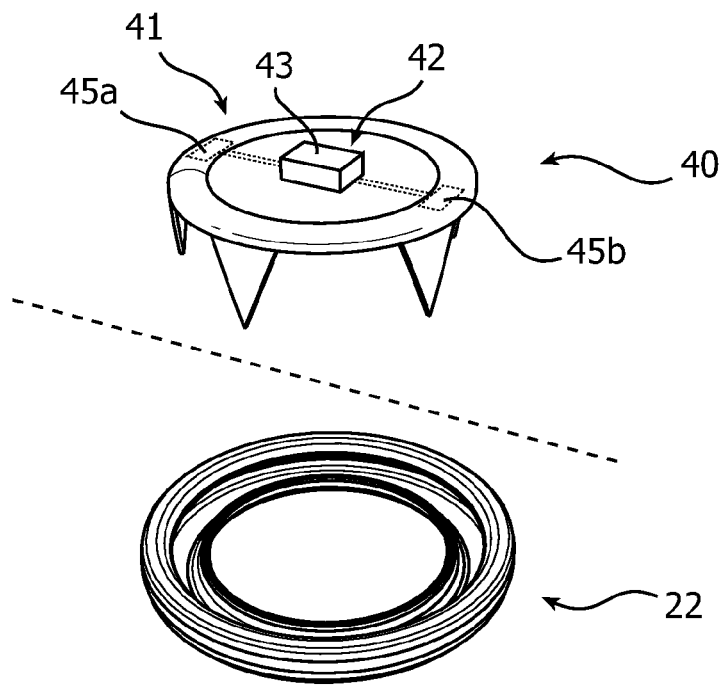
FIGS. 3a-b schematically illustrate two exemplary embodiments of the electronic assembly according to the invention, where the electronic device(s) is/are integrated in the clamping member(s)
Figure 3B:
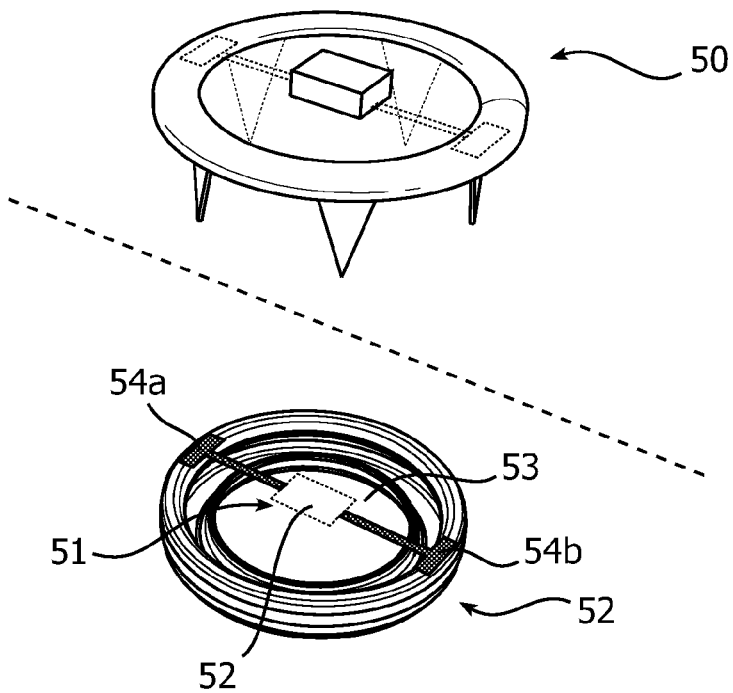

FIGS. 3a-b schematically illustrate two examples of a second embodiment of the electronic assembly according to the invention.

In FIG. 3a, an electronic assembly 40 is shown, comprising a first clamping member 41 in which an electronic device 42 is integrated, and a second clamping member 22 similar to that described above in connection with FIGS. 2a-b.

As is schematically illustrated in FIG. 3a, the first clamping member 41 includes an electronic component 43 and a component carrier 44. Terminals (not shown) of the electronic component are electrically connected to contact pads 45a-b provided on the opposite side of the component carrier 44, as indicated by the dashed rectangles in FIG. 3a.

In FIG. 3b, another exemplary electronic assembly 50 is schematically shown, which differs from the electronic assembly 40 in FIG. 3a in that the additional electronic device 51 is integrated in the second clamping member 52. This additional electronic device 51 comprises, as is illustrated in FIG. 3b, an electronic component 52 which is mounted on a component carrier 53, and terminals (not shown) of the electronic component 52 are electrically connected to contact pads 54a-b.

In FIG. 2b and FIG. 3b above, two exemplary configurations for dual side attachment of electronic devices to a fabric substrate have been schematically illustrated. Obviously, these configuration may be combined with each other in such a way that one electronic device is integrated in a clamping member as shown in FIGS. 3a-b, while the other electronic device is provided separately as shown in FIGS. 2a-b.

A method for manufacturing an electronic textile according to an embodiment of the invention will now be described with reference to the flow chart in FIG. 4 and the schematic illustrations of the electronic textile in different stages of manufacturing provided in FIGS. 5a-d.

Referring first to FIG. 4 and FIG. 5a, a fabric substrate 60 having a conductor pattern 61 comprising two electrically separated leads 62a-b on a first side 63 thereof is provided in a first step 401. In a subsequent step 402, referring to FIG. 5b, the electronic device 64 and the first clamping member 65 are aligned to the conductor pattern 61. In the presently illustrated exemplary electronic assembly, which corresponds to that previously described in connection with FIG. 2a, the electronic device 64 comprises an electronic component 66 which is mounted on a component carrier 67 having contact pads 68a-b which are electrically connected to (not shown) terminals of the electronic component 66. More specifically, in the present step 402, the electronic device 64 is positioned in such a way that the contact pads 68a-b are aligned with corresponding leads 62a-b in the fabric substrate 60, and the first clamping member 65 is positioned to have a portion thereof corresponding to the contact pads 68a-b on the electronic device 64 and the leads 62a-b in the fabric substrate 60. Furthermore, the first clamping member 65 is positioned so that the tooth-shaped prongs 69a-c will not unintentionally sever any of the leads 62a-b in the conductor pattern 61 when subsequently penetrating the fabric substrate 60.

Referring now to FIG. 4 and FIG. 5c, the second clamping member 70 having a recess 71 configured to receive and interlock with the prongs 69a-c of the first clamping member 65 is positioned on the opposite side 72 of the fabric substrate 60 in the next step 403.

The second clamping member 70 is positioned so that portions thereof are aligned with corresponding portions of the first clamping member 65, contact pads 68a-b of the electronic device 64 and leads 62a-b provided on the first side 63 of the fabric substrate 60.

In a final step 404, the first 65 and second 70 clamping members are pressed towards each other on the opposing sides 63, 72 of the fabric substrate 60. In this process, the prongs 69a-c of the first clamping member 65 penetrate the fabric substrate and engage with the recess 71 of the second clamping member 70. During this engagement, the prongs 69a-c are deformed and interlock with the recess to form a durable interlocking bond between the first 65 and second 70 clamping member pressing the contact pads 68a-b of the electronic device against the leads 62a-b of the fabric substrate 60, thereby attaching the electronic assembly to the fabric substrate 60 while electrically connecting the electronic device 64 to the conductor pattern 61 on the first side 63 of the fabric substrate 60.

Figure 6:
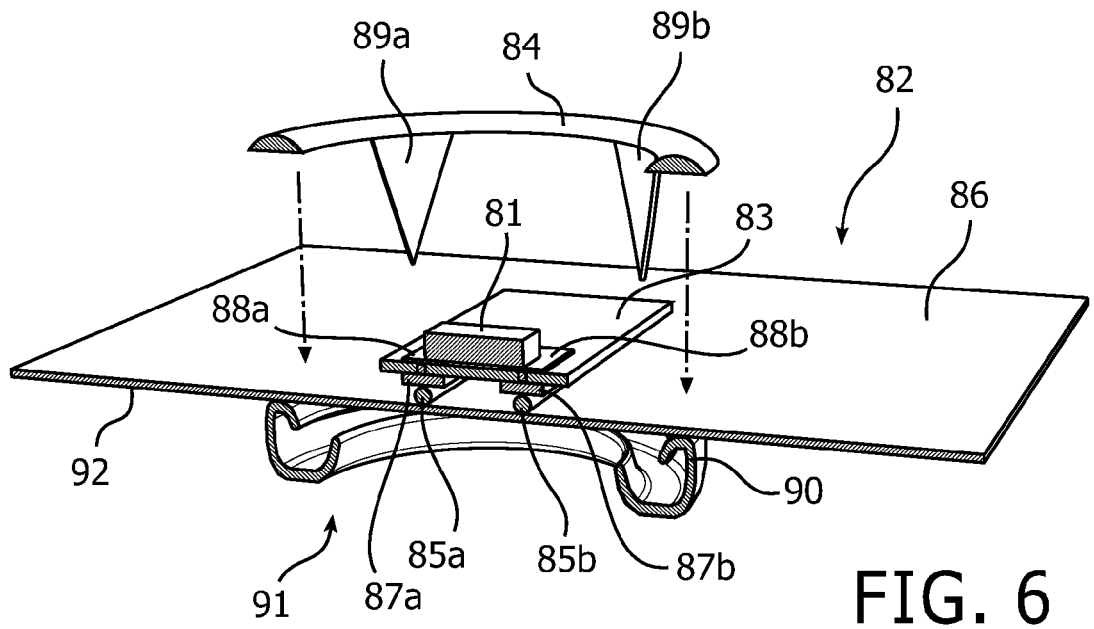
FIG. 6 is an exploded perspective section view of a first exemplary electronic assembly attached to a fabric substrate.

Having now described an exemplary method of manufacturing an electronic textile comprising an electronic assembly according to an embodiment of the present invention, two examples of such electronic textiles will now be described with reference to FIGS. 6 and 7. First, an electronic textile 80 having a monocolor LED 81 attached and connected thereto will be described with reference to FIG. 6, showing a fabric substrate 82, a monocolor LED 81 mounted on a component carrier 83, and a first, annularly shaped clamping member 84. The fabric substrate 82 has a conductor pattern including two electrically separated leads 85a-b on a first side 86 thereof. The component carrier 83 has two contact pads 87a-b which are electrically connected to the anode 88a and cathode 88b, respectively, of the monocolor LED 81.

These contact pads 87a-b are pressed against the leads 85a-b through the locking engagement of prongs 89a-b provided on the first clamping member 84 and a corresponding recess 90 of a second clamping member 91 provided on an opposing second side 92 of the fabric substrate 82.

Figure 7:
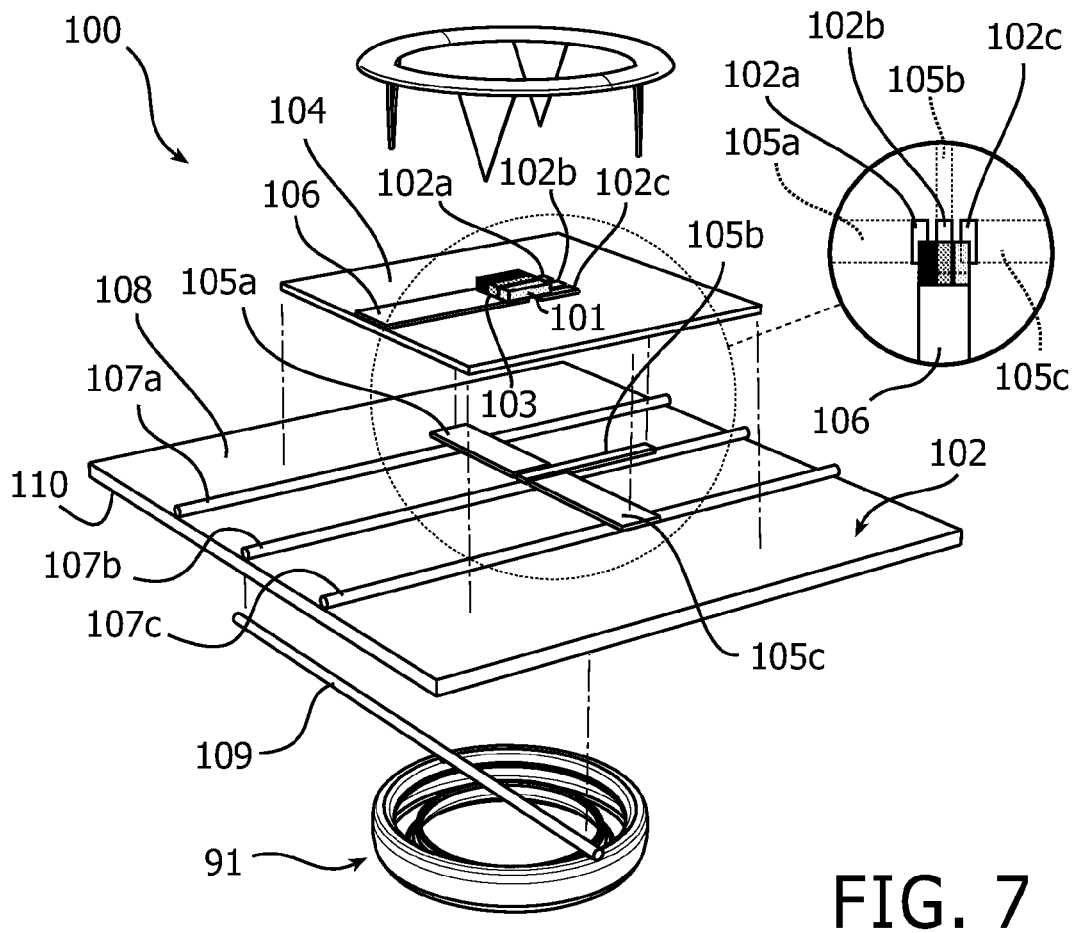
FIG. 7 is an exploded perspective view of a second exemplary electronic assembly attached to a fabric substrate.

Turning now to FIG. 7, an electronic textile 100 having a multicolor LED module 101 attached to a fabric substrate 102 will be described.

In contrast to the electronic textile 80 described above in connection with FIG. 6, the electronic textile 100 in FIG. 7 utilizes contact patterns provided on both sides of the fabric substrate 102.

FIG. 7 shows the multicolor LED-module 101 having three cathode terminals 102a-c, one for each color, red (R), green (G), and blue (B), and an anode terminal 103 common to the three colors R, G, B. The multicolor LED-module 101 is mounted on a component carrier 104 having three contact pads 105a-c on a side thereof facing the fabric substrate 102, each of which is electrically connected to a corresponding one of the cathode terminals 102a-c. The component carrier 104 further has a top side contact pad 106 which is electrically connected to the anode terminal 103 of the multicolor LED-module 101. The fabric substrate has three electrically separated leads 107a-c on the front side 108 thereof, and a further lead 109 on the backside 110 thereof.

As illustrated in FIG. 7, the leads 107a-c on the front side 108 of the fabric substrate 102 are pressed against the contact pads 105a-c, and the lead 109 on the backside 110 of the fabric substrate is pressed against the second clamping member 91. This backside lead 109 is thereby electrically connected with the anode terminal 103 of the multicolor LED-module 101 via the second clamping member 91 the prongs 89a-d of the first clamping member and the top side contact pad 106.

In the embodiment shown in Fig., at least portions of the first 84 and second 91 clamping members need to be electrically conductive in order to connect the multi-color LED 101 to the backside lead 109 through the fabric substrate 102.

The person skilled in the art realizes that the present invention by no means is limited to the preferred embodiments described above. For example, the clamping members need not be circular, but can have any other shape, such as square, elongated etc. Furthermore, the locking engagement between the clamping members need not be penetrating the fabric substrate, but could take place without penetration, or a single clamping member could be used for clamping the electronic device against the fabric. Additionally, in the case of either or both the clamping members having structures for penetrating the fabric substrate, these structures may be provided in various configurations, as long as they are capable of bringing about locking engagement between the clamping members. Moreover, the electrical contact between the electronic device and the conductor pattern on the fabric substrate may be further improved by using a conduction enhancing substance, such as conductive glue or solder.

The invention claimed is:

1. An electronic assembly attachable to a fabric substrate having a first conductor pattern on a first side thereof and a second conductor pattern on a second side thereof, the electronic assembly comprising:
   a first electronic device,
   at least a first clamping member configured to clamp said first electronic device to the first side of the fabric substrate in such a way that said first electronic device is electrically connected to said conductor pattern, and
   a second electronic device, wherein said electronic assembly is configured to clamp said second electronic device to said second conductor pattern in such a way that said second electronic device is electrically connected to said second conductor pattern.

2. The electronic assembly according to claim 1, further comprising a second clamping member configured to lockingly engage with said first clamping member through the fabric substrate.

3. The electronic assembly according to claim 2, wherein at least one of said first and second electronic devices is integrated with said first and/or second clamping members.

4. The electronic assembly according to claim 2, wherein at least one of said first and second clamping members comprises a structure for penetrating said fabric substrate and interlocking with the opposing clamping member.

5. The electronic assembly according to claim 1, wherein at least one of said first and second electronic devices comprises at least one contact structure for pressing against said first and/or second conductor patterns, respectively, to thereby facilitating an electrical connection therebetween.

6. The electronic assembly according to claim 3, wherein at least one of said first and second electronic devices comprises an electronic component mounted on a component carrier having said at least one contact structure arranged to face said first or second side of the fabric substrate, respectively.

7. The electronic assembly according to claim 1, configured to electrically connect at least one of said first and second electronic devices to two electrically separated conductors in said first and/or second conductor pattern on the first and/or second side of the fabric substrate, respectively.

8. The electronic assembly according to claim 1, configured to connect said first electronic device between a first conductor on said first side of the fabric substrate and a second conductor on an opposing second side of the fabric substrate.

9. The electronic textile comprising a fabric substrate, and an electronic assembly according to claim 1.

10. A method for manufacturing an electronic textile, comprising the steps of:
   providing a fabric substrate having a first conductor pattern on a first side thereof;
   providing an electronic assembly comprising first and second electronic devices, and at least a first clamping member;
   positioning said first clamping member and said first electronic device on said first side of the fabric substrate;
   aligning said electronic device to said first conductor pattern; and
   locking said first clamping member in relation to the fabric substrate to clamp said electronic device to the first side thereof, thereby electrically connecting said electronic device to said conductor pattern, wherein said electronic assembly is configured to clamp said second electronic device to said second conductor pattern in such a way that said second electronic device is electrically connected to said second conductor pattern.

11. A method according to claim 10, wherein said electronic assembly further comprises a second clamping member adapted to lockingly engage with said first clamping member through said fabric substrate, said method further comprising the step of: positioning said second clamping member on a second side of the fabric substrate opposite said first clamping member.

12. A method according to claim 11, wherein said step of locking comprises the step of: moving said first and second clamping members towards each other until they lockingly engage through said fabric substrate, thereby electrically connecting said electronic device to said conductor pattern through clamping.

13. A method according to claim 10, wherein said first electronic device comprises a contact structure for pressing against said first conductor pattern to thereby achieve an electrical connection therebetween, and wherein said step of aligning comprises the step of: aligning said contact structure to said conductor pattern.

14. A method according to claim 13, further comprising the step of: aligning said first clamping member to said contact structure.

* * * * *